(12) United States Patent
Huang (10) Patent No.: US 9,762,224 B2
(45) Date of Patent: Sep. 12, 2017

(54) TIMING PREDICTION CIRCUIT AND METHOD (71) Applicant: Huawei Technologies Co., Ltd., Shenzhen (CN)

(72) Inventor: Tao Huang, Shenzhen (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 9 days.

(21) Appl. No.: 15/057,509

(22) Filed: Mar. 1, 2016

(65) Prior Publication Data

US 2016/0261257 A1 Sep. 8, 2016

(30) Foreign Application Priority Data

Mar. 2, 2015 (CN) .......................... 2015 1 0092987

(51) Int. Cl.
H03K 5/19 (2006.01)
H03K 5/24 (2006.01)

(52) U.S. Cl.
CPC ...................... H03K 5/24 (2013.01)

(58) Field of Classification Search
CPC ..... G06F 1/08; G06F 1/10; G06F 1/04; G06F 1/14; G06F 1/3203
USPC .......................... 327/3, 12, 20, 291; 713/500
See application file for complete search history.

(56) References Cited

U.S. PATENT DOCUMENTS

| | | | | |
|---|---|---|---|---|
| 7,257,723 B2 * | 8/2007 | Galles | .................. | G06F 1/3203 713/321 |
| 2009/0206904 A1 * | 8/2009 | Shimura | ............... | G06F 1/3203 327/199 |
| 2011/0304357 A1 * | 12/2011 | Tokairin | ................... | H03K 5/26 327/12 |
| 2014/0317433 A1 | 10/2014 | Fatemi et al. | | |
| 2015/0033061 A1 * | 1/2015 | Yu | ........................... | G06F 21/50 713/501 |

OTHER PUBLICATIONS

Mitra, S., et al., "Robust System Design with Built-In Soft-Error Resilience," Cover Feature, IEEE Computer Society, Feb. 2005, pp. 43-52.

* cited by examiner

*Primary Examiner* — Quan Tra
(74) *Attorney, Agent, or Firm* — Conley Rose, P.C.

(57) ABSTRACT

A timing prediction circuit and method which relate to the field of circuit technologies and may be used to predict a timing margin of a to-be-predicted digital circuit, which are used to resolve a problem that a large quantity of devices are used to predict a probability that a timing error occurs in a to-be-predicted digital circuit. The timing prediction circuit includes a combinational logic circuit, a delay circuit, a sampling circuit, and a control circuit, where the sampling circuit includes N samplers, and an input end of each sampler is separately connected to an output end of the combinational logic circuit using the delay circuit, and an output end of each sampler is connected to an input end of the control circuit, where N is an integer equal, and N≥2. The present invention can be used to predict a timing margin of a to-be-predicted digital circuit.

11 Claims, 4 Drawing Sheets

TIMING PREDICTION CIRCUIT AND METHOD

CROSS-REFERENCE TO RELATED APPLICATION

This application claims priority to Chinese Patent Application No. 201510092987.9, filed on Mar. 2, 2015, which is hereby incorporated by reference in its entirety.

TECHNICAL FIELD

The present disclosure relates to the field of circuit technologies, and in particular, to a timing prediction circuit and method.

BACKGROUND

In a chip system, a chip has a specific safe working voltage (the safe working voltage is a voltage range) at a specific frequency. Because voltage fluctuation and voltage deviation exist in a power supply system that supplies power to the chip, when the chip works at a non-safety working voltage, a timing error may occur in a digital circuit in the chip, and the timing error of the digital circuit may be a timing error on a timing path of a timing logic circuit in the digital circuit.

Currently, a probability that a timing error occurs in the digital circuit may be predicted using the following method. One prediction trigger is connected in parallel to each sampling trigger of the timing logic circuit, and a delay unit is connected before the prediction trigger (such that a timing margin of a timing path on which the prediction trigger is located is less than a timing margin of a timing path on which the sampling trigger is located), a control circuit compares a sampling result of a sampling trigger and a sampling result of a prediction trigger. If a sampling result of one sampling trigger of multiple sampling triggers in the timing logic circuit is different from a sampling result of a prediction trigger that is connected in parallel to the sampling trigger, the control circuit determines that a probability that a timing error occurs in the digital circuit is relatively high, and if sampling results of the multiple sampling triggers in the timing logic circuit are all the same as sampling results of prediction triggers that are connected in parallel to the multiple sampling triggers, the control circuit determines that a probability that a timing error occurs in the digital circuit is relatively low.

Because there are many sampling triggers in a timing logic circuit, in a process in which the foregoing method is used to determine a probability that a timing error occurs in a digital circuit, prediction triggers whose quantity is equal to a quantity of sampling triggers in the timing logic circuit are added. As a result, a large quantity of devices are used and a large chip area is occupied.

SUMMARY

Embodiments of the present disclosure provide a timing prediction circuit and method, which are used to resolve a problem that a large quantity of devices are used to predict a probability that a timing error occurs in a to-be-predicted digital circuit.

To achieve the foregoing objective, the following technical solutions are used in the embodiments of the present disclosure:

According to a first aspect, a timing prediction circuit is provided, including a combinational logic circuit, a delay circuit, a sampling circuit, and a control circuit, where the sampling circuit includes N sampling units, and an input end of each sampling unit is separately connected to an output end of the combinational logic circuit using the delay circuit, and an output end of each sampling unit is connected to an input end of the control circuit, where N is an integer equal, and N≥2, where an input end of the combinational logic circuit is configured to input a prediction signal, where the prediction signal is transmitted to the delay circuit using the combinational logic circuit. The delay circuit is configured to delay the prediction signal transmitted to the delay circuit such that compared with a prediction signal input to another sampling unit in the N sampling units, prediction signals input to N−1 sampling units in the N sampling units each have a different degree of delay. The sampling unit is configured to perform, at a sampling moment, sampling on a prediction signal input to the sampling unit, to obtain a sampling result, and the control circuit is configured to determine, according to results of comparison between sampling results of the N sampling units and a reference sampling result, whether a timing margin of a to-be-predicted digital circuit needs to be adjusted.

With reference to the first aspect, in a first possible implementation manner, the control circuit is further configured to, if in one working clock cycle, a quantity of sampling results that are the same as the reference sampling result in the sampling results of the N sampling units is less than or equal to a threshold, determine that the timing margin of the to-be-predicted digital circuit needs to be adjusted, where the working clock cycle refers to a working clock cycle of the sampling circuit, or if in each working clock cycle of multiple working clock cycles that are arranged in chronological order, a quantity of sampling results that are the same as the reference sampling result in the sampling results of the N sampling units decreases progressively, determine that the timing margin of the to-be-predicted digital circuit needs to be adjusted, where the working clock cycle refers to the working clock cycle of the sampling circuit.

With reference to the first aspect or the first possible implementation manner of the first aspect, in a second possible implementation manner, the prediction circuit further includes a source signal generator, where an output end of the source signal generator is connected to the input end of the combinational logic circuit, and the source signal generator is configured to generate a periodically flipped prediction signal, and a cycle of the periodically flipped prediction signal is the working clock cycle.

With reference to the first aspect or either of the first possible implementation manner and the second possible implementation manner of the first aspect, in a third possible implementation manner, compared with a prediction signal input to an $(n-1)^{th}$ sampling unit in the N sampling units, a prediction signal input to an $n^{th}$ sampling unit in the N sampling units has a delay in a preset time period, where $2 \leq n \leq N$, and n is an integer.

With reference to the first aspect or any one of the first possible implementation manner to the third possible implementation manner of the first aspect, in a fourth possible implementation manner, the prediction circuit further includes N logical operation units connected to the N sampling units, where one sampling unit corresponds to one logical operation unit. The logical operation unit includes a first input end, a second input end, and an output end. Each first input end is configured to input the reference sampling result. Each second input end is connected to an output end of one sampling unit, and the output end of each logical operation unit is connected to the input end of the control circuit, and the logical operation unit is configured to compare a sampling result input by the second input of the logical operation unit and the reference sampling result, to obtain a result of the comparison.

With reference to the first aspect or any one of the first possible implementation manner to the fourth possible implementation manner of the first aspect, in a fifth possible implementation manner, the to-be-predicted digital circuit further includes an internal memory, and the prediction circuit further includes a second internal memory, where a working clock of the second internal memory is synchronized with a working clock of the to-be-predicted digital circuit, and a timing margin of a timing path of the second internal memory is less than a timing margin of a timing path of the internal memory. The second internal memory includes an input end and an output end. The input end of the second internal memory is configured to input to-be-written data, and the output end of the second internal memory is connected to the input end of the control circuit, and the control circuit is further configured to, when data output by the output end of the second internal memory is different from the to-be-written data, determine that the timing margin of the to-be-predicted digital circuit needs to be adjusted.

According to a second aspect, a timing prediction method is provided, including acquiring results of comparison between M sampling results and a reference sampling result, where the M sampling results are sampling results obtained by performing, at a sampling moment, sampling on prediction signals having different delays, and determining, according to the results of comparison, whether a timing margin of a to-be-predicted digital circuit needs to be adjusted.

With reference to the second aspect, in a first possible implementation manner, the determining, according to the results of comparison, whether a timing margin of a to-be-predicted digital circuit needs to be adjusted includes, if in one working clock cycle, a quantity of sampling results that are the same as the reference sampling result in the M sampling results is less than or equal to a threshold, determining that the timing margin of the to-be-predicted digital circuit needs to be adjusted, where the working clock cycle refers to a working clock cycle to which the sampling moment belongs, or if in each working clock cycle of multiple working clock cycles that are arranged in chronological order, a quantity of sampling results that are the same as the reference sampling result in the M sampling results decreases progressively, determining that the timing margin of the to-be-predicted digital circuit needs to be adjusted, where the working clock cycle refers to the working clock cycle to which the sampling moment belongs.

With reference to the second aspect, in a second possible implementation manner, the method further includes acquiring to-be-written data in a second internal memory and data output by the second internal memory, where a working clock of the second internal memory is synchronized with a working clock of the to-be-predicted digital circuit, and a timing margin of a timing path of the second internal memory is less than a timing margin of a timing path of an internal memory, and when the data output by the second internal memory is different from the to-be-written data, determining that the timing margin of the to-be-predicted digital circuit needs to be adjusted.

With reference to the first possible implementation manner or the second possible implementation manner of the second aspect, in a third possible implementation manner, after the determining that the timing margin of the to-be-predicted digital circuit needs to be adjusted, the method further includes decreasing a working clock frequency of the to-be-predicted digital circuit and/or increasing a working voltage of the to-be-predicted digital circuit.

With reference to the third possible implementation manner of the second aspect, in a fourth possible implementation manner, after the decreasing a working clock frequency of the to-be-predicted digital circuit and/or increasing a working voltage of the to-be-predicted digital circuit, the method further includes, when it is determined that the timing margin of the to-be-predicted digital circuit needs to be adjusted, continuing to decrease the working clock frequency of the to-be-predicted digital circuit and/or increase the working voltage of the to-be-predicted digital circuit, or when it is determined that the timing margin of the to-be-predicted digital circuit does not need to be adjusted, increasing the working clock frequency of the to-be-predicted digital circuit and/or decreasing the working voltage of the to-be-predicted digital circuit.

According to the timing prediction circuit and method provided by the embodiments of the present disclosure, a prediction signal input to each sampling unit has a different degree of delay, and when a time taken by a prediction signal input to a combinational logic circuit to arrive at an input end of a sampling unit after the prediction signal is transmitted by the combinational logic circuit and a delay circuit is less than or equal to one working clock cycle, a sampling result obtained by the sampling unit by performing sampling on the prediction signal input to the sampling unit is the same as a reference sampling result (that is, the sampling result is correct). Therefore, a timing margin of a to-be-predicted digital circuit may be predicted according to whether the sampling result is correct and a degree of delay of the prediction signal input to each sampling unit, and further, it is determined whether the timing margin of the to-be-predicted digital circuit needs to be adjusted. In the technical solutions provided by the embodiments of the present disclosure, a quantity of sampling units is not limited, and a function of predicting a value of a timing margin of a to-be-predicted digital circuit can be implemented using a few sampling units, and compared with the prior art, there is no need to add a large quantity of triggers or occupy a large chip area.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the embodiments of the present disclosure with reference to the accompanying drawings in the embodiments of the present disclosure. The described embodiments are merely some but not all of the embodiments of the present disclosure. All other embodiments obtained by a person of ordinary skill in the art based on the embodiments of the present disclosure without creative efforts shall fall within the protection scope of the present disclosure.

The term "and/or" in this specification describes only an association relationship for describing associated objects and represents that three relationships may exist. For example, A and/or B may represent the following three cases: Only A exists, both A and B exist, and only B exists. In addition, "multiple" in this specification refers to two or more than two.

Embodiment 1

Figure 1:
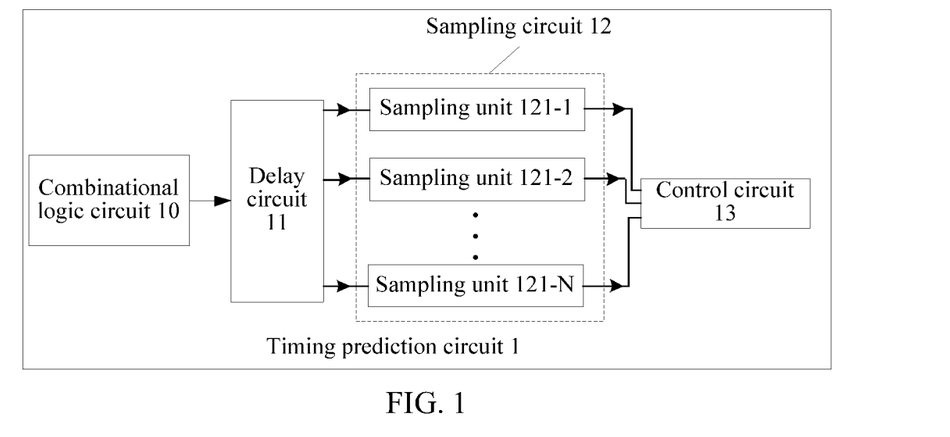
FIG. 1 is a schematic composition diagram of a timing prediction circuit according to an embodiment of the present disclosure.

An embodiment of the present disclosure provides a timing prediction circuit 1, as shown in FIG. 1, including a combinational logic circuit 10, a delay circuit 11, a sampling circuit 12, and a control circuit 13, where the sampling circuit 12 includes N sampling units 121, and an input end of each sampling unit 121 is separately connected to an output end of the combinational logic circuit 10 using the delay circuit 11, and an output end of each sampling unit 121 is connected to an input end of the control circuit 13, where N is an integer equal, and N≥2, where an input end of the combinational logic circuit 10 is configured to input a prediction signal, where the prediction signal is transmitted to the delay circuit 11 using the combinational logic circuit 10. The delay circuit 11 is configured to delay the prediction signal transmitted to the delay circuit 11 such that compared with a prediction signal input to another sampling unit 121 in the N sampling units 121, prediction signals input to N−1 sampling units 121 in the N sampling units 121 each have a different degree of delay. The sampling unit 121 is configured to perform, at a sampling moment, sampling on the prediction signal input to the sampling unit 121, to obtain a sampling result, and the control circuit 13 is configured to determine, according to results of comparison between sampling results of the N sampling units 121 and a reference sampling result, whether a timing margin of a to-be-predicted digital circuit needs to be adjusted.

The N sampling units 121 in this embodiment of the present disclosure are represented as a sampling unit 121-1, a sampling unit 121-2, . . . , and a sampling unit 121-N in FIG. 1 to FIG. 5. In addition, to make the accompanying drawings clear, an input end and an output end of each unit in this embodiment of the present disclosure are both shown using arrow directions in the accompanying drawings.

It should be noted that a digital chip or a digital-analog mixed chip generally includes a digital circuit, and the digital circuit includes a combinational logic circuit and an internal memory. Either timing error on a timing path of the internal memory or a timing error on a timing path of the combinational logic circuit causes a timing error in the digital circuit to which the internal memory or the combinational logic circuit belongs. As a result, the chip to which the digital circuit belongs cannot work normally. Under the premise that the digital circuit works normally, a larger timing margin of the timing path of the internal memory or a larger timing margin of the timing path of the combinational logic circuit indicates a smaller risk that a timing error occurs in the digital circuit. Timing of the digital circuit refers to timing of a timing path of the digital circuit, and the timing margin of the digital circuit refers to a timing margin of the timing path of the digital circuit.

In addition, it should be noted that the timing path of the combinational logic circuit refers to a path between a source trigger and a sampling trigger in a timing logic circuit, and when time taken for transmitting, using the combinational logic circuit, a predication signal output by the source trigger is less than or equal to one working clock cycle of the sampling trigger, a sampling result obtained through sampling by the sampling trigger is a sampling result of the prediction signal.

In this embodiment of the present disclosure, the combinational logic circuit 10 is an equivalent circuit of a combinational logic circuit in the to-be-predicted digital circuit.

In addition, the timing prediction circuit 1 may further include a reference sampling circuit configured to generate the reference sampling result.

It should be noted that, for a same prediction signal, the reference sampling result refers to a sampling result (that is, a correct sampling result) of the prediction signal, which may be a sampling result obtained by performing sampling on a prediction signal that is input to the combinational logic circuit 10 in a working clock cycle to which sampling moment belongs. When a time taken for transmitting, by the combinational logic circuit 10 and the delay circuit 11 to the input end of the sampling unit 121, the prediction signal input to the combinational logic circuit 10 is less than or equal to one working clock cycle, a sampling result obtained by the sampling unit 121 by performing sampling on the prediction signal input to the sampling unit 121 is correct. Otherwise, the sampling result is incorrect. Further, in this embodiment of the present disclosure, when it is determined whether a sampling result is correct, when a sampling result of a sampling unit 121 is the same as the reference sampling result, it may indicate that the sampling result of the sampling unit 121 is correct. Otherwise, the sampling result of the sampling unit 121 is incorrect. The working clock cycle refers to a working clock cycle of the sampling circuit.

Figure 2:
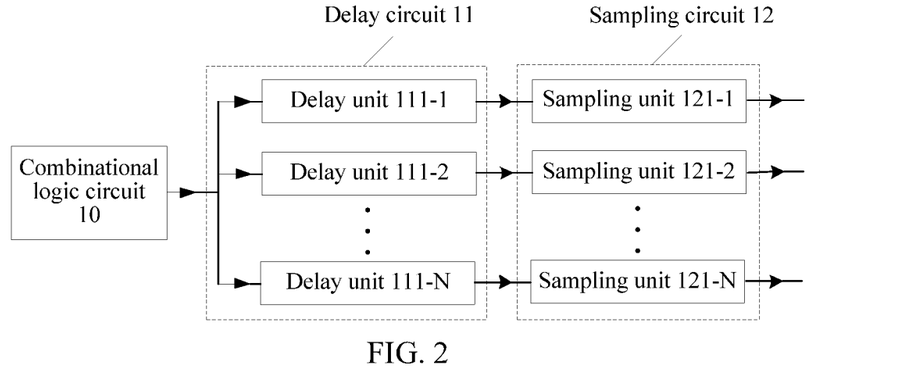
FIG. 2 is a diagram of connections of some circuits of a timing prediction circuit according to an embodiment of the present disclosure.
Figure 3:
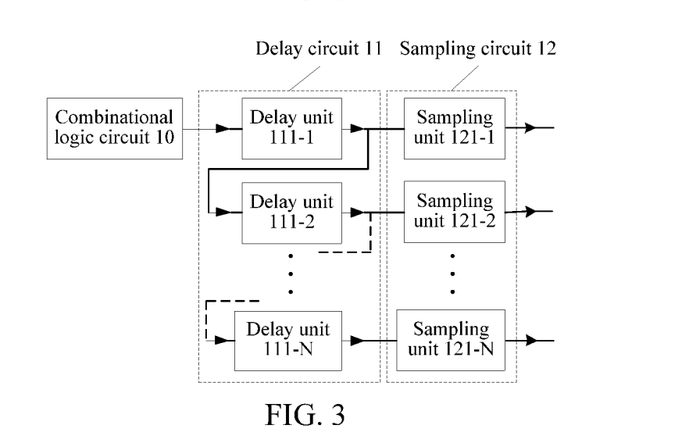
FIG. 3 is a diagram of connections of some circuits of another timing prediction circuit according to an embodiment of the present disclosure.

The delay circuit 11 may include N delay units 111, where delays of the N delay units 111 are different, and a delay of one delay unit 111 in the N delay units 111 is 0, and each delay unit 111 includes an input end and an output end. Exemplarily, a connection relationship among the delay unit 111, the combinational logic circuit 10, and the N sampling units 121 may be (1) the input end of each delay unit 111 is connected to the output end of the combinational logic circuit 10, an output end of an $m^{th}$ delay unit 111 is connected to an input end of an $m^{th}$ sampling unit 121, and for details, refer to FIG. 2, or (2) a delay of a first delay unit 111 is 0 (the first delay unit 111 is a delay unit 111-1 in FIG. 3), an input end of the first delay unit 111 is connected to the output end of the combinational logic circuit 10, an input end of an $n^{th}$ delay unit 111 is connected to an input end of an $(n-1)^{th}$ sampling unit 121, an output end of the $n^{th}$ delay unit is connected to an input end of an $n^{th}$ sampling unit 121, and for details, refer to FIG. 3, where $1 \leq m \leq N$, $2 \leq n \leq N$, and m and n are integers. In FIG. 2 and FIG. 3, the N delay units 111 are represented as the delay unit 111-1, a delay unit 111-2, ..., and a delay unit 111-N in the accompanying drawings.

The quantity N of the sampling units 121 may be set according to an actual situation, which is not limited in this embodiment of the present disclosure. For example, when an working environment of the digital chip or the digital-analog mixed chip is poor, the quantity of the sampling units 121 may be set to be larger in order to more accurately determine whether the timing margin of the to-be-predicted digital circuit needs to be adjusted. In addition, the sampling unit 121 may include one or more triggers, and in a same working clock cycle, sampling moments of the N sampling units 121 are the same.

The timing prediction circuit 1 may be integrated with a circuit in an existing digital chip or digital-analog mixed chip, or may be used as a prediction module independently to predict a value of a timing margin of a digital circuit in the digital chip or the digital-analog mixed chip.

In addition, in order to more accurately predict the timing margin of the to-be-predicted digital circuit, working clocks of the sampling circuit 12, the combinational logic circuit 10, and the to-be-predicted digital circuit may be synchronized.

According to the timing prediction circuit provided by this embodiment of the present disclosure, a prediction signal input to each sampling unit has a different degree of delay, and when a time taken by a prediction signal input to a combinational logic circuit to arrive at an input end of a sampling unit after the prediction signal is transmitted by the combinational logic circuit and a delay circuit is less than or equal to one working clock cycle, a sampling result obtained by the sampling unit by performing sampling on the prediction signal input to the sampling unit is the same as a reference sampling result (that is, the sampling result is correct). Therefore, a timing margin of a to-be-predicted digital circuit may be predicted according to whether the sampling result is correct and a degree of delay of the prediction signal input to each sampling unit, and further, it is determined whether the timing margin of the to-be-predicted digital circuit needs to be adjusted. In the technical solutions provided by this embodiment of the present disclosure, a quantity of sampling units is not limited, and a function of predicting a value of a timing margin of a to-be-predicted digital circuit can be implemented using a few sampling units, and compared with the prior art, there is no need to add a large quantity of triggers or occupy a large chip area.

Optionally, the control circuit 13 is further configured to, if in one working clock cycle, a quantity of sampling results that are the same as the reference sampling result in the sampling results of the N sampling units 121 is less than or equal to a threshold, determine that the timing margin of the to-be-predicted digital circuit needs to be adjusted, where the working clock cycle refers to a working clock cycle of the sampling circuit, or if in each working clock cycle of multiple working clock cycles that are arranged in chronological order, a quantity of sampling results that are the same as the reference sampling result in the sampling results of the N sampling units 121 decreases progressively, determine that the timing margin of the to-be-predicted digital circuit needs to be adjusted, where the working clock cycle refers to the working clock cycle of the sampling circuit.

Furthermore, in one working clock cycle, fewer sampling results that are the same as the reference sampling result in the sampling results of the N sampling units 121, that is, fewer correct sampling results, indicate a smaller timing margin of the to-be-predicted digital circuit such that a risk that a timing error occurs in the to-be-predicted digital circuit is larger. In this case, the timing margin of the to-be-predicted digital circuit needs to be adjusted.

Figure 4:
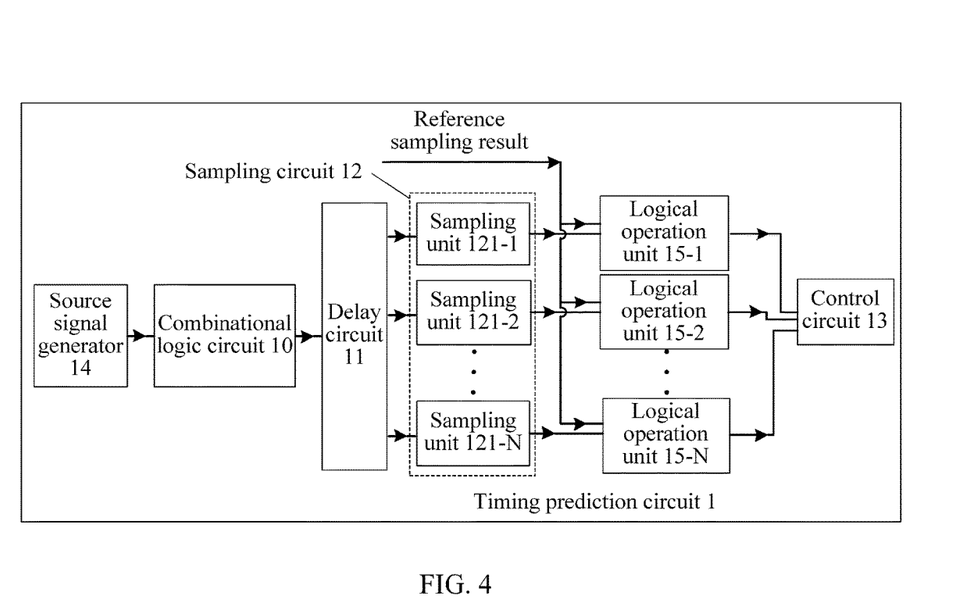
FIG. 4 is a schematic composition diagram of another timing prediction circuit according to an embodiment of the present disclosure.

Optionally, as shown in FIG. 4, the timing prediction circuit 1 may further include a source signal generator 14, where an output end of the source signal generator 14 is connected to the input end of the combinational logic circuit 10, and the source signal generator 14 is configured to generate a periodically flipped prediction signal, and a cycle of the periodically flipped prediction signal is the working clock cycle.

It should be noted that a prediction signal input by the combinational logic circuit 10 arrives at the sampling unit 121 after the prediction signal is transmitted by the combinational logic circuit 10 and the delay circuit 11. When a transmission time of a prediction signal A input to the combinational logic circuit 10 (the transmission time refers to a time taken by the prediction signal input to the combinational logic circuit 10 to arrive at the sampling unit 121 after the prediction signal is transmitted by the combinational logic circuit 10 and the delay circuit 11) is less than or equal to one working clock cycle, a sampling result is a sampling result obtained by the sampling unit 121 by performing sampling on the prediction signal A. Otherwise, a sampling result is a sampling result obtained by the sampling unit 121 by performing sampling on a previous signal of the prediction signal A. In this case, when multiple successive prediction signals input to the combinational logic circuit 10 are the same, there may be a deviation in a determining result of determining whether the timing margin of the to-be-predicted digital circuit needs to be adjusted.

In this optional solution, the periodically flipped prediction signal generated by the source signal generator 14 can avoid a problem that when multiple successive prediction signals input to the combinational logic circuit 10 are the same, there may be a deviation in the determining result of determining whether the timing margin of the to-be-predicted digital circuit needs to be adjusted.

Optionally, compared with a prediction signal input to an $(n-1)^{th}$ sampling unit 121 in the N sampling units 121, a prediction signal input to an $n^{th}$ sampling unit 121 in the N sampling units 121 has a delay in a preset time period.

Further, a length of the preset time period may be set according to an actual situation, which is not limited in this embodiment of the present disclosure.

Further, in a case in which the length of the preset duration is known, the timing margin of the timing path of the combinational logic circuit 10 in the to-be-predicted digital circuit may be estimated. For example, when the sampling circuit 12 includes eight sampling units 121, a transmission time taken to transmit a prediction signal to a first sampling unit 121 is X nanosecond (ns). Compared with a prediction signal input to a previous sampling unit 121, prediction signals input to a second sampling unit 121 to an eighth sampling unit 121 each have a delay of 0.2 ns. In a case in which sampling results of two sampling units 121 in sampling results of the eight sampling units 121 are incorrect, because a sampling result obtained by a sampling unit 121 by performing sampling on a prediction signal input to the sampling unit 121 is correct when a transmission time is less than or equal to one working clock cycle, it may be obtained that the timing margin of the timing path of the combinational logic circuit 10 is from 1 ns to 1.2 ns. Furthermore, a correspondence among a sampling unit 121, a transmission time, and a sampling result is shown in Table 1:

TABLE 1

| Sampling unit 121 | Transmission time | Sampling result |
| --- | --- | --- |
| First sampling unit 121 | X ns | Correct |
| Second sampling unit 121 | (X + 0.2) ns | Correct |
| Third sampling unit 121 | (X + 0.4) ns | Correct |
| Fourth sampling unit 121 | (X + 0.6) ns | Correct |
| Fifth sampling unit 121 | (X + 0.8) ns | Correct |
| Sixth sampling unit 121 | (X + 1) ns | Correct |
| Seventh sampling unit 121 | (X + 1.2) ns | Incorrect |
| Eighth sampling unit 121 | (X + 1.4) ns | Incorrect |

When a value of N is very large, and compared with a prediction signal input to a previous sampling unit 121, a delay of a prediction signal input to each sampling unit 121 is very small, the timing margin of the timing path of the combinational logic circuit 10 may be estimated relatively accurately.

Optionally, as shown in FIG. 4, the timing prediction circuit 1 may further include N logical operation units 15 connected to the N sampling units 121, where one sampling unit 121 corresponds to one logical operation unit 15. The logical operation unit 15 includes a first input end, a second input end, and an output end. Each first input end is configured to input the reference sampling result. Each second input end is connected to an output end of one sampling unit 121, and the output end of each logical operation unit 15 is connected to the input end of the control circuit 13, and the logical operation unit 15 is configured to compare a sampling result input by the second input of the logical operation unit 15 and the reference sampling result, to obtain a result of the comparison.

The N logical operation units 15 in this embodiment of the present disclosure are represented as a logical operation unit 15-1, a logical operation unit 15-2, . . . , and a logical operation unit 15-N in the accompanying drawings.

Furthermore, the logical operation unit 15 may be an XOR gate, an XNOR gate, or the like. In this solution, the logical operation unit 15 may obtain a result of the comparison by determining whether the sampling result of the sampling unit 121 is the same as the reference sampling result.

In addition, the timing prediction circuit 1 may further include N recording units connected to the N logical operation units 15, where one logical operation unit 15 corresponds to one recording unit, an input end of each recording unit is connected to an output end of one logical operation unit 15, and an output end of each recording unit is connected to the input end of the control circuit 13. The recording unit is configured to record a result of comparison obtained by the logical operation unit 15 in one or more working clock cycles.

Figure 5:
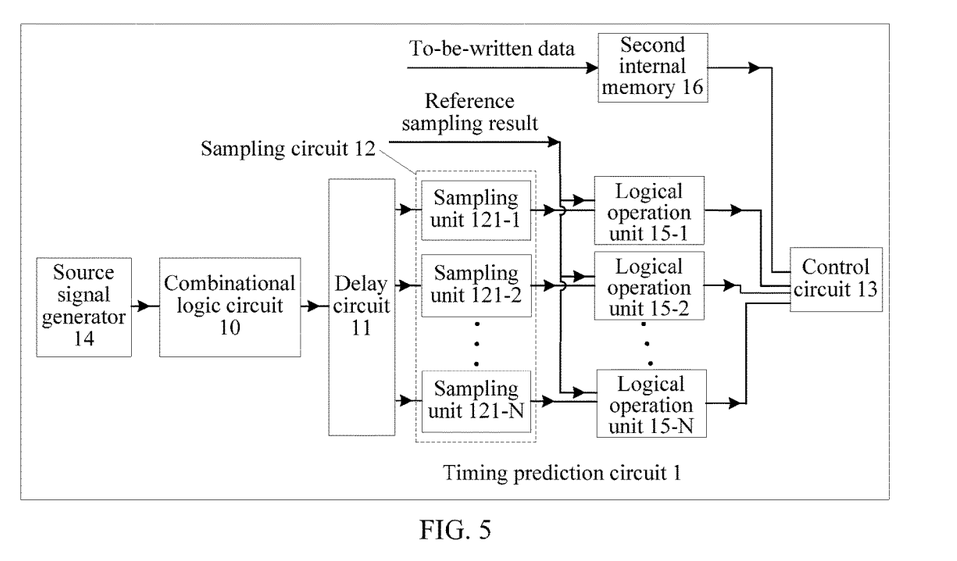
FIG. 5 is a schematic composition diagram of another timing prediction circuit according to an embodiment of the present disclosure.

Optionally, the to-be-predicted digital circuit may further include an internal memory, and as shown in FIG. 5, the timing prediction circuit 1 may further include a second internal memory 16, where a working clock of the second internal memory 16 is synchronized with a working clock of the to-be-predicted digital circuit, and a timing margin of a timing path of the second internal memory 16 is less than a timing margin of a timing path of the internal memory, where the second internal memory 16 includes an input end and an output end. The input end of the second internal memory 16 is configured to input to-be-written data, and the output end of the second internal memory 16 is connected to the input end of the control circuit 13, and the control circuit 13 is further configured to, when data output by the output end of the second internal memory 16 is different from the to-be-written data, determine that the timing margin of the to-be-predicted digital circuit needs to be adjusted.

The input end of the second internal memory 16 may be connected to the control circuit 13 or another module, and the control circuit 13 or the another module writes the to-be-written data into the second internal memory 16 using the input end.

Because the timing margin of the timing path of the second internal memory 16 is less than the timing margin of the timing path of the internal memory, if the data output by the output end of the second internal memory 16 is different from the to-be-written data, it may be considered that the timing margin of the timing path of the internal memory is relatively small, and it is determined that the timing margin of the to-be-predicted digital circuit needs to be adjusted.

It should be noted that in a chip system, when a voltage and a working frequency of a chip are relatively low, a timing error occurs on a timing path of an internal memory in a digital circuit earlier than a timing error occurs on a timing path of a combinational logic circuit in the digital circuit. In this embodiment of the present disclosure, it is determined, using the second internal memory 16, whether the timing margin of the to-be-predicted digital circuit needs to be adjusted, thereby avoiding a timing error on the timing path of the internal memory in the to-be-predicted digital circuit when a voltage and a working frequency of a chip are relatively low.

Figure 6:
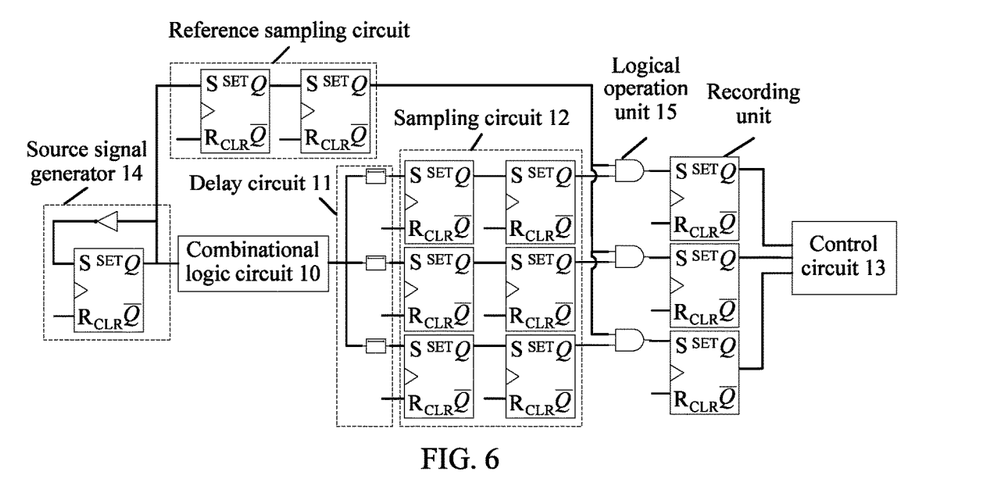
FIG. 6 is a schematic composition diagram of still another timing prediction circuit according to an embodiment of the present disclosure.

In addition, as shown in FIG. 6, a timing prediction circuit 1 is shown, where a source signal generator 14 includes a source trigger and a phase inverter, a sampling unit 121 includes two triggers, an logical operation unit 15 is an XOR gate, a recording unit includes one trigger, and a reference sampling circuit includes two triggers.

Embodiment 2

Figure 7:
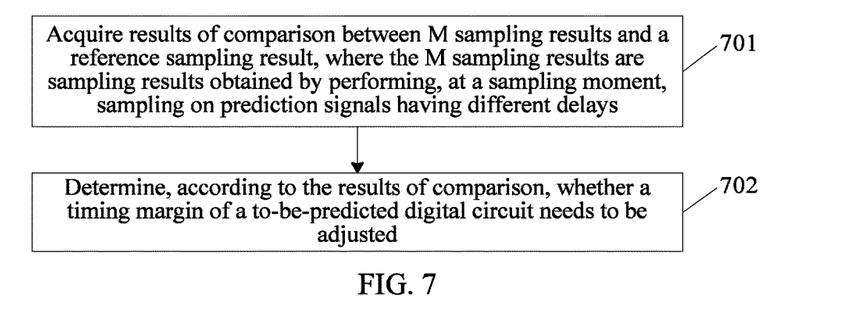
FIG. 7 is a flowchart of a timing prediction method according to an embodiment of the present disclosure.

This embodiment of the present disclosure provides a timing prediction method. The method may be further applied to any one of the timing prediction circuits provided above, and for related explanations in this embodiment, reference may be made to the foregoing descriptions. As shown in FIG. 7, the method includes the following step 701 and step 702.

Step 701: Acquire results of comparison between M sampling results and a reference sampling result, where the M sampling results are sampling results obtained by performing, at a sampling moment, sampling on prediction signals having different delays.

It should be noted that the embodiment is performed by any one of the timing prediction circuits provided above.

The M sampling results may be sampling results in one working clock cycle or may be sampling results in multiple working clock cycles. It should be noted that in a same working clock cycle, sampling moments at which sampling is performed on input prediction signals having different delays are the same.

Further, when a time taken for transmitting, by the combinational logic circuit and a delay circuit to an input end of a sampling unit, a prediction signal input to a combinational logic circuit is less than or equal to one working clock cycle, a sampling result obtained by the sampling unit by performing sampling on the input prediction signal is correct. Otherwise, a sampling result is incorrect.

It should be noted that, for a same prediction signal, the reference sampling result refers to a sampling result (that is, a correct sampling result) of the prediction signal, which may be further a sampling result obtained by performing sampling on a prediction signal that is input to the combinational logic circuit in a working clock cycle to which sampling moment belongs. When a time taken for transmitting, by the combinational logic circuit and a delay circuit to an input end of a sampling unit, a prediction signal input to a combinational logic circuit is less than or equal to one working clock cycle, a sampling result obtained by the sampling unit by performing sampling on the prediction signal input to the sampling unit is correct. Otherwise, a sampling result is incorrect. Further, in this embodiment of the present disclosure, when it is determined whether a sampling result is correct, when a sampling result of a sampling unit is the same as the reference sampling result, it may indicate that the sampling result of the sampling unit is correct. Otherwise, the sampling result of the sampling unit is incorrect.

Step 702: Determine, according to the results of comparison, whether a timing margin of a to-be-predicted digital circuit needs to be adjusted.

Optionally, in specific implementation, step 702 may include, if in one working clock cycle, a quantity of sampling results that are the same as the reference sampling result in the M sampling results is less than or equal to a threshold, determining that the timing margin of the to-be-predicted digital circuit needs to be adjusted, where the working clock cycle refers to a working clock cycle to which the sampling moment belongs, or if in each working clock cycle of multiple working clock cycles that are arranged in chronological order, a quantity of sampling results that are the same as the reference sampling result in the M sampling results decreases progressively, determining that the timing margin of the to-be-predicted digital circuit needs to be adjusted, where the working clock cycle refers to the working clock cycle to which the sampling moment belongs.

Further, in a working clock cycle, fewer sampling results that are the same as the reference sampling result in the M sampling results, that is, fewer correct sampling results, indicate a smaller timing margin of the to-be-predicted digital circuit such that a risk that a timing error occurs on a timing path in the to-be-predicted digital circuit is larger. In this case, the timing margin of the to-be-predicted digital circuit needs to be adjusted.

Figure 8:
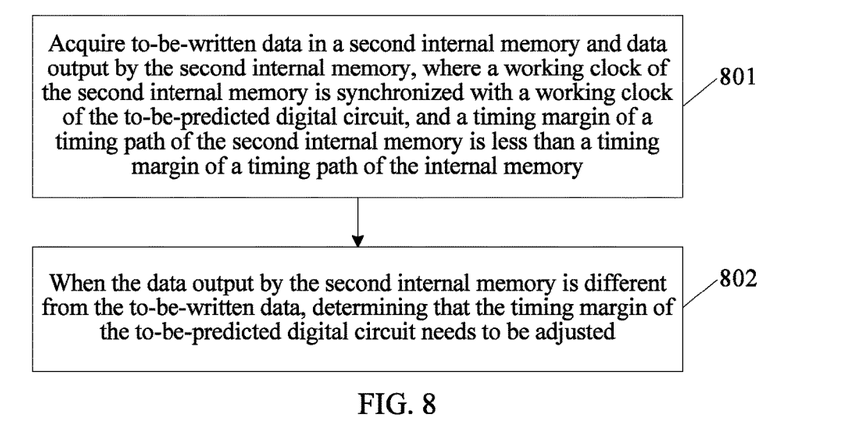
FIG. 8 is a flowchart of another timing prediction method according to an embodiment of the present disclosure.

Optionally, as shown in FIG. 8, the method may further include the following step 801 and step 802.

Step 801: Acquire to-be-written data in a second internal memory and data output by the second internal memory, where a working clock of the second internal memory is synchronized with a working clock of the to-be-predicted digital circuit, and a timing margin of a timing path of the second internal memory is less than a timing margin of a timing path of the internal memory.

Step 802: When the data output by the second internal memory is different from the to-be-written data, determining that the timing margin of the to-be-predicted digital circuit needs to be adjusted.

An order of step 701 to step 702 and step 801 to step 802 is not limited in this embodiment of the present disclosure.

Furthermore, because the timing margin of the timing path of the second internal memory is less than the timing margin of the timing path of the internal memory, if data output by an output end of the second internal memory is different from the to-be-written data, it may be considered that the timing margin of the timing path of the internal memory is relatively small, and it is determined that the timing margin of the to-be-predicted digital circuit needs to be adjusted.

Optionally, after the determining that the timing margin of the to-be-predicted digital circuit needs to be adjusted, the method may further include decreasing a working clock frequency of the to-be-predicted digital circuit and/or increasing a working voltage of the to-be-predicted digital circuit.

The timing prediction circuit may directly decrease the working clock frequency of the to-be-predicted digital circuit and/or increase the working voltage of the to-be-predicted digital circuit, or may send a control message to another circuit such that the another circuit decreases the working clock frequency of the to-be-predicted digital circuit and/or increases the working voltage of the to-be-predicted digital circuit according to the control message. According to the optional method, the risk that a timing error occurs in the to-be-predicted digital circuit can be reduced by adjusting the timing margin of the to-be-predicted digital circuit.

Optionally, after the decreasing a working clock frequency of the to-be-predicted digital circuit and/or increasing a working voltage of the to-be-predicted digital circuit, the method further includes, when it is determined that the timing margin of the to-be-predicted digital circuit needs to be adjusted, continuing to decrease the working clock frequency of the to-be-predicted digital circuit and/or increase the working voltage of the to-be-predicted digital circuit, or when it is determined that the timing margin of the to-be-predicted digital circuit does not need to be adjusted, increasing the working clock frequency of the to-be-predicted digital circuit and/or decreasing the working voltage of the to-be-predicted digital circuit.

It should be noted that in a chip system, under the premise that the chip system works normally, lower power consumption of the system is more favourable, and in the optional solution, when it is determined that the timing margin of the to-be-predicted digital circuit does not need to be adjusted, the working clock frequency of the to-be-predicted digital circuit may be increased and/or the working voltage of the to-be-predicted digital circuit may be decreased to implement a function of reducing the power consumption of the chip system.

According to the timing prediction method provided by this embodiment of the present disclosure, a reference sampling result is a correct sampling result, and because sampling results are sampling results obtained by performing, at a sampling moment, sampling on prediction signals having different delays, and whether a sampling result is correct is related to a degree of delay of a prediction signal, whether multiple sampling results are the same as the reference sampling result may be used to determine whether the sampling result is correct, and a value of a timing margin of a to-be-predicted digital circuit is predicted with reference to the degree of delay of the prediction signal such that it is determined whether the timing margin of the to-be-predicted digital circuit needs to be adjusted. The technical solutions provided by this embodiment of the present disclosure may be applied to a timing prediction circuit and do not limit a quantity of sampling units in the timing prediction circuit, and a function of predicting a value of a timing margin of a to-be-predicted digital circuit can be implemented using a few sampling units, and compared with the prior art, there is no need to add a large quantity of triggers or occupy large chip area.

Embodiment 3

Figure 9:
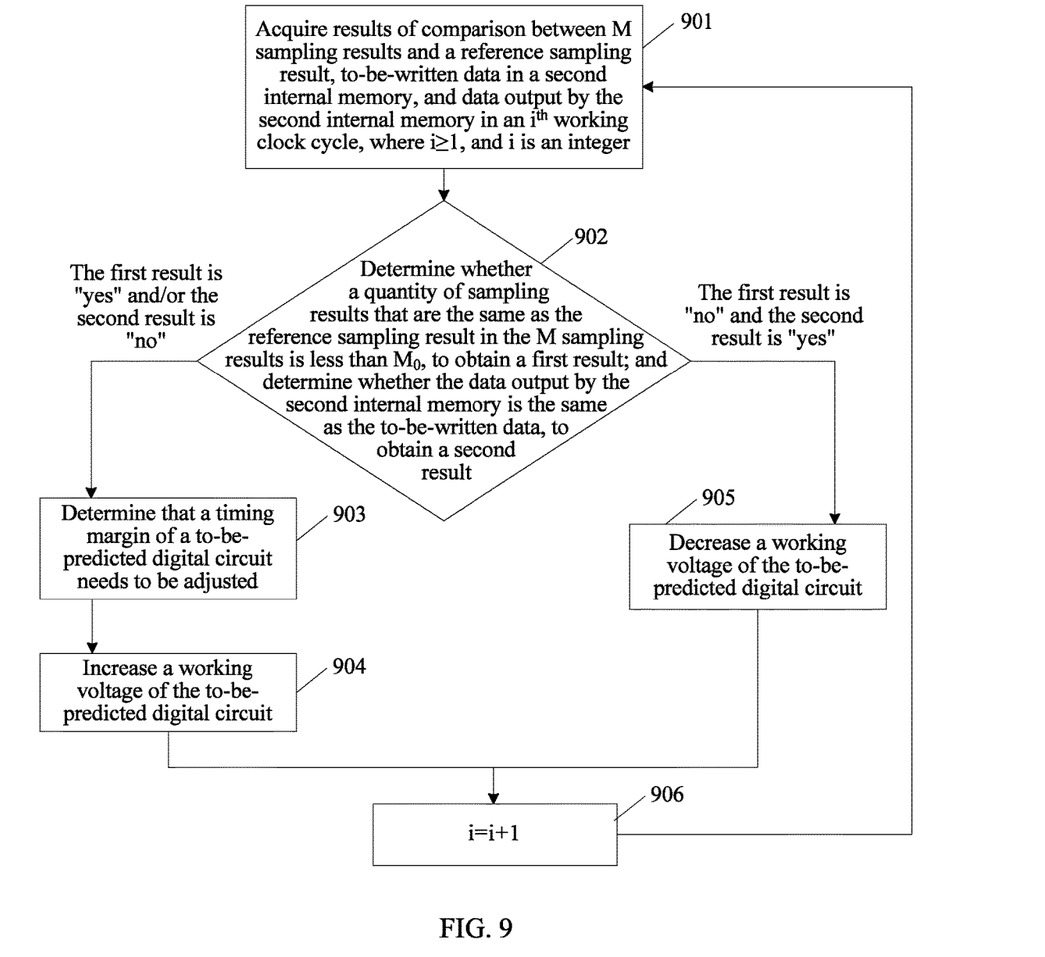
FIG. 9 is a flowchart of still another timing prediction method according to an embodiment of the present disclosure.

This embodiment exemplarily describes the timing prediction method in Embodiment 2, where M sampling results are sampling results in one working clock cycle, and for related explanations in this embodiment, reference may be made to the foregoing embodiment. As shown in FIG. 9, the method includes the following steps.

Step 901: Acquire results of comparison between M sampling results and a reference sampling result, to-be-written data in a second internal memory, and data output by the second internal memory in an $i^{th}$ working clock cycle, where i≥1, and i is an integer.

Step 902: Determine whether a quantity of sampling results that are the same as the reference sampling result in the M sampling results is less than $M_0$, to obtain a first result, and determine whether the data output by the second internal memory is the same as the to-be-written data, to obtain a second result.

The first result and the second result may both be "yes" or "no".

If the first result is "yes" and/or the second result is "no", step 903 is performed, and if the first result is "no" and the second result is "yes", step 905 is performed.

Step 903: Determine that a timing margin of a to-be-predicted digital circuit needs to be adjusted.

Step 904: Increase a working voltage of the to-be-predicted digital circuit.

After step 904 is performed, step 906 is performed.

Step 905: Decrease a working voltage of the to-be-predicted digital circuit.

After step 905 is performed, step 906 is performed.

Step 906: i=i+1.

After step 906 is performed, go back to step 901.

According to the timing prediction method provided by this embodiment of the present disclosure, a reference sampling result is a correct sampling result, and because sampling results are sampling results obtained by performing, at a sampling moment, sampling on prediction signals having different delays, and whether a sampling result is correct is related to a degree of delay of a prediction signal, whether multiple sampling results are the same as the reference sampling result may be used to determine whether the sampling result is correct, and a value of a timing margin of a to-be-predicted digital circuit is predicted with reference to the degree of delay of the prediction signal such that it is determined whether the timing margin of the to-be-predicted digital circuit needs to be adjusted. The technical solutions provided by this embodiment of the present disclosure may be applied to a timing prediction circuit and do not limit a quantity of sampling units in the timing prediction circuit, and a function of predicting a value of a timing margin of a to-be-predicted digital circuit can be implemented using a few sampling units, and compared with the prior art, there is no need to add a large quantity of triggers or occupy large chip area.

The foregoing descriptions are merely specific implementation manners of the present disclosure, but are not intended to limit the protection scope of the present disclosure. Any variation or replacement readily figured out by a person skilled in the art within the technical scope disclosed in the present disclosure shall fall within the protection scope of the present disclosure. Therefore, the protection scope of the present disclosure shall be subject to the protection scope of the claims.

What is claimed is:

1. A timing prediction circuit, comprising:
   a combinational logic circuit, wherein an input end of the combinational logic circuit is configured to input a prediction signal;
   a delay circuit coupled to the combinational logic circuit, wherein an input end of the delay circuit is configured to receive the prediction signal from the combinational logic circuit;
   a sampling circuit comprising N samplers, wherein N is an integer and N≥2, wherein an input end of each sampler is separately connected to an output end of the delay circuit;
   a control circuit, wherein an output end of each sampler is connected to an input end of the control circuit, wherein the delay circuit is configured to delay the prediction signal received by the delay circuit such that each prediction signal input to N−1 samplers in the N samplers has a different degree of delay, wherein each of the N samplers is configured to sample, at a sampling moment, the prediction signal input to each of the samplers and to obtain a sampling result for each of the N samplers, wherein the control circuit is configured to determine, according to results of comparison between the sampling results of the N samplers and a reference sampling result, whether a timing margin of a to-be-predicted digital circuit is to be adjusted; and
   an internal memory coupled to the control circuit, wherein the internal memory comprises an input end and an output end, wherein the input end is configured to input to-be-written data and the output end is coupled to the control circuit, and wherein the control circuit is configured to determine that the timing margin of the to-be-predicted digital circuit is to be adjusted when data output from the output end is different from the to-be-written data.

2. The timing prediction circuit according to claim 1, wherein the control circuit is further configured to:
   determine that the timing margin of the to-be-predicted digital circuit needs to be adjusted when in one working clock cycle, a quantity of sampling results that are same as the reference sampling result in the sampling results of the N samplers are less than or equal to a threshold, and wherein the working clock cycle refers to a working clock cycle of the sampling circuit; and
   determine that the timing margin of the to-be-predicted digital circuit needs to be adjusted when in each working clock cycle of multiple working clock cycles that are arranged in chronological order, the quantity of sampling results that are same as the reference sampling result in the sampling results of the N samplers decreases progressively, and wherein the working clock cycle refers to the working clock cycle of the sampling circuit.

3. The timing prediction circuit according to claim 1, further comprising a source signal generator, wherein an output end of the source signal generator is connected to the input end of the combinational logic circuit, wherein the source signal generator is configured to generate a periodically flipped prediction signal, and wherein a cycle of the periodically flipped prediction signal is a working clock cycle.

4. The timing prediction circuit according to claim 1, wherein compared with a prediction signal input to an $(n-1)^{th}$ sampler in the N samplers, a prediction signal input to an $n^{th}$ sampler in the N samplers has a delay in a preset time period, wherein $2 \leq n \leq N$, and wherein n is an integer.

5. The timing prediction circuit according to claim 1, further comprising N logical operators connected to the N samplers, wherein one sampler corresponds to one logical operator, wherein the logical operator comprises a first input end, a second input end, and an output end, wherein each first input end is configured to input the reference sampling result, wherein each second input end is connected to the output end of one logical operator, wherein an output end of each logical operator is connected to the input end of the control circuit, and wherein the logical operator is configured to compare the sampling result input by the second input of the logical operator and the reference sampling result, to obtain a result of the comparison.

6. The timing prediction circuit according to claim 1, wherein the to-be-predicted digital circuit further comprises a second internal memory, wherein a working clock of the internal memory is synchronized with a working clock of the to-be-predicted digital circuit, and wherein a timing margin of a timing path of the internal memory is less than a timing margin of a timing path of the second internal memory.

7. A timing prediction method, comprising:
acquiring results of comparison between M sampling results and a reference sampling result, wherein the M sampling results are sampling results obtained by performing, at a sampling moment, sampling on prediction signals having different delays;
determining, according to the results of comparison, whether a timing margin of a to-be-predicted digital circuit needs to be adjusted;
acquiring to-be-written data in a second internal memory and outputting data by the second internal memory, and wherein a timing margin of a timing path of the second internal memory is less than a timing margin of a timing path of an internal memory; and
determining that the timing margin of the to-be-predicted digital circuit is to be adjusted when the data output by the second internal memory is different from the to-be-written data.

8. The timing prediction method according to claim 7, wherein determining, according to the results of comparison, whether the timing margin of the to-be-predicted digital circuit needs to be adjusted comprises:
determining that the timing margin of the to-be-predicted digital circuit needs to be adjusted when in one working clock cycle, a quantity of sampling results that are the same as the reference sampling result in the M sampling results is less than or equal to a threshold, wherein the working clock cycle refers to the working clock cycle to which the sampling moment belongs; and
determining that the timing margin of the to-be-predicted digital circuit needs to be adjusted when in each working clock cycle of multiple working clock cycles that are arranged in chronological order, the quantity of sampling results that are same as the reference sampling result in the M sampling results decreases progressively, wherein the working clock cycle refers to the working clock cycle to which the sampling moment belongs.

9. The timing prediction method according to claim 7, wherein a working clock of the second internal memory is synchronized with a working clock of the to-be-predicted digital circuit, and wherein a timing margin of a timing path of the second internal memory is less than a timing margin of a timing path of an internal memory.

10. The timing prediction method according to claim 8, wherein after determining that the timing margin of the to-be-predicted digital circuit needs to be adjusted, the method further comprises decreasing a working clock frequency of the to-be-predicted digital circuit and/or increasing a working voltage of the to-be-predicted digital circuit.

11. The timing prediction method according to claim 10, wherein after decreasing the working clock frequency of the to-be-predicted digital circuit and/or increasing the working voltage of the to-be-predicted digital circuit, the method further comprises:
continuing to decrease the working clock frequency of the to-be-predicted digital circuit and/or increase the working voltage of the to-be-predicted digital circuit when it is determined that the timing margin of the to-be-predicted digital circuit needs to be adjusted; and
increasing the working clock frequency of the to-be-predicted digital circuit and/or decreasing the working voltage of the to-be-predicted digital circuit when it is determined that the timing margin of the to-be-predicted digital circuit does not need to be adjusted.

* * * * *